US008901417B2

(12) United States Patent  (10) Patent No.: US 8,901,417 B2
Herring et al.  (45) Date of Patent: Dec. 2, 2014

(54) NETWORK ENCLOSURE WITH REMOVABLE AND INTERCHANGEABLE SIDES

(75) Inventors: Nathaniel L. Herring, Mystic, CT (US);
John E. Lamoreux, Plainfield, CT (US);
Brian T. Martino, Hope Valley, RI (US)

(73) Assignee: Hubbell Incorporated, Shelton, CT (US)

( * ) Notice: Subject to any disclaimer, the term of this patent is extended or adjusted under 35 U.S.C. 154(b) by 1063 days.

(21) Appl. No.: 12/149,924

(22) Filed: May 9, 2008

(65) Prior Publication Data
US 2008/0289873 A1    Nov. 27, 2008

Related U.S. Application Data

(60) Provisional application No. 60/924,384, filed on May 11, 2007.

(51) Int. Cl.
*H05K 5/00*  (2006.01)
*H05K 5/02*  (2006.01)

(52) U.S. Cl.
CPC ............ *H05K 5/0217* (2013.01); *H05K 5/0008* (2013.01)
USPC .............. 174/50; 174/547; 174/562; 454/184

(58) Field of Classification Search
USPC ............. 361/679.45, 679.4; 454/184; 174/50, 174/547, 562
See application file for complete search history.

(56) References Cited

U.S. PATENT DOCUMENTS

| 5,276,279 | A |   | 1/1994  | Brownlie et al. |
| 5,280,135 | A |   | 1/1994  | Berlin et al. |
| 5,297,004 | A | * | 3/1994  | Mazura ......................... 361/690 |
| 5,345,779 | A | * | 9/1994  | Feeney .......................... 62/259.2 |
| 5,542,757 | A | * | 8/1996  | Chang ......................... 312/223.2 |
| 5,696,350 | A |   | 12/1997 | Anker |
| 5,770,817 | A |   | 6/1998  | Lo |
| 5,853,098 | A |   | 12/1998 | Elder |
| 6,005,189 | A |   | 12/1999 | Anker |
| 6,145,683 | A |   | 11/2000 | Taniguchi |
| 6,414,241 | B1 |  | 7/2002  | O'Donnell |
| 6,460,951 | B1 |  | 10/2002 | Baxter et al. |
| 6,616,005 | B1 |  | 9/2003  | Pereira et al. |
| 6,980,421 | B2 | * | 12/2005 | Shih-Tsung ............. 361/679.21 |
| 7,006,352 | B2 | * | 2/2006  | Tseng et al. ............... 361/679.4 |
| 2006/0076348 | A1 |  | 4/2006 | Michaud |

* cited by examiner

*Primary Examiner* — Hung V Ngo
(74) *Attorney, Agent, or Firm* — William E. Bradley; Mark S. Bicks; Alfred N. Goodman

(57) ABSTRACT

A networking enclosure with removable and interchangeable sides includes a housing with an internal cavity for receipt of electrical devices and first, second, and third openings. The enclosure also includes first, second, and third sets of panels corresponding to each of the openings. The first set of panels includes at least two panels with different configurations and being selectively engageable with the housing to substantially close the first opening. The second set of panels includes at least two panels with different configurations and being selectively engageable with the housing to substantially close the second opening. Similarly, the third set of panels includes at least two panels having different configurations and being selectively engageably with the housing to substantially close the third opening. The panels can be solid or include apertures such as knockouts, louvers, or a combination thereof.

9 Claims, 8 Drawing Sheets

NETWORK ENCLOSURE WITH REMOVABLE AND INTERCHANGEABLE SIDES

CROSS-REFERENCE TO RELATED APPLICATIONS

This application claims the benefit of U.S. Provisional Application 60/924,384 filed May 11, 2007, which application is hereby incorporated by reference in its entirety.

FIELD OF THE INVENTION

The present invention relates to a telecommunications enclosure box with removable sides or panels interchangeable with customized panels preferably having knockouts and/or louvers. More particularly, the invention relates to a modular system for a network enclosure box where a top surface, a bottom surface, and a front surface each include a set of differently configured panels to customize the configuration and access openings for each surface.

BACKGROUND OF THE INVENTION

The organization and management of voice and data telecommunications networks in building, residential, and office environments involve the provision of connection assemblies in or near work environments. These connection assemblies establish connection points for both horizontal and vertical runs of cables with one another or with patch cords providing routing to work stations. These connection assemblies further facilitate terminations between the horizontal cables and patch cords which remain undisturbed when the patch cords leading to the work stations have to be reconfigured to make changes in the work station arrangements.

Similarly, conventional residential telecommunication network enclosures typically include preset configurations for receiving electrical connectors. Thus, if an enclosure needs to accommodate modification in the field such as with respect to an input or output device different from what was originally installed, a new enclosure box must be purchased or the box must be physically modified in the field. Therefore, a need exists for a universal or modular box system with removable and customized panels.

U.S. Pat. No. 6,460,951 to Baxter et al. is hereby incorporated herein by reference.

SUMMARY OF THE INVENTION

Accordingly, an object of the present invention is to provide a network enclosure having removable and interchangeable panels.

A further object of the invention is to provide a network enclosure having removable and interchangeable panels with a variety of knockout and louver configurations.

Another object of the invention is to provide a network enclosure having interchangeable panels customized and configured for a specific application.

Still another object of the invention is to provide a network enclosure having a top panel with custom fit configurations.

The foregoing objects are basically attained by providing a networking enclosure with removable sides or panels comprising a housing having an internal cavity for receipt of electrical devices and first, second, and third openings. The enclosure also includes first, second, and third sets of panels corresponding to each of the openings. The first set of panels includes at least two panels with different configurations and being selectively engageable with the housing to substantially close the first opening. The second set of panels includes at least two panels with different configurations and being selectively engageable with the housing to substantially close the second opening. Similarly, the third set of panels includes at least two panels having different configurations and being selectively engageably with the housing to substantially close the third opening. The panels can be solid or include apertures such as knockouts, louvers, or a combination thereof.

By forming the network enclosure in this manner, the enclosure can accommodate a variety of telecommunication connections in a residential environment without limiting the application to a preset configuration.

As used in this application, the terms "top", "bottom", and "side" are intended to facilitate the description of the network enclosure, and are not intended to limit the description of the network enclosure to any particular orientation.

Other objects, advantages, and salient features of the present invention will become apparent from the following detailed description, which, taken in conjunction with the annexed drawings, discloses preferred embodiments of the invention.

BRIEF DESCRIPTION OF THE DRAWINGS

Referring to the drawings which form a part of this disclosure.

DETAILED DESCRIPTION OF THE INVENTION

Figure 1:
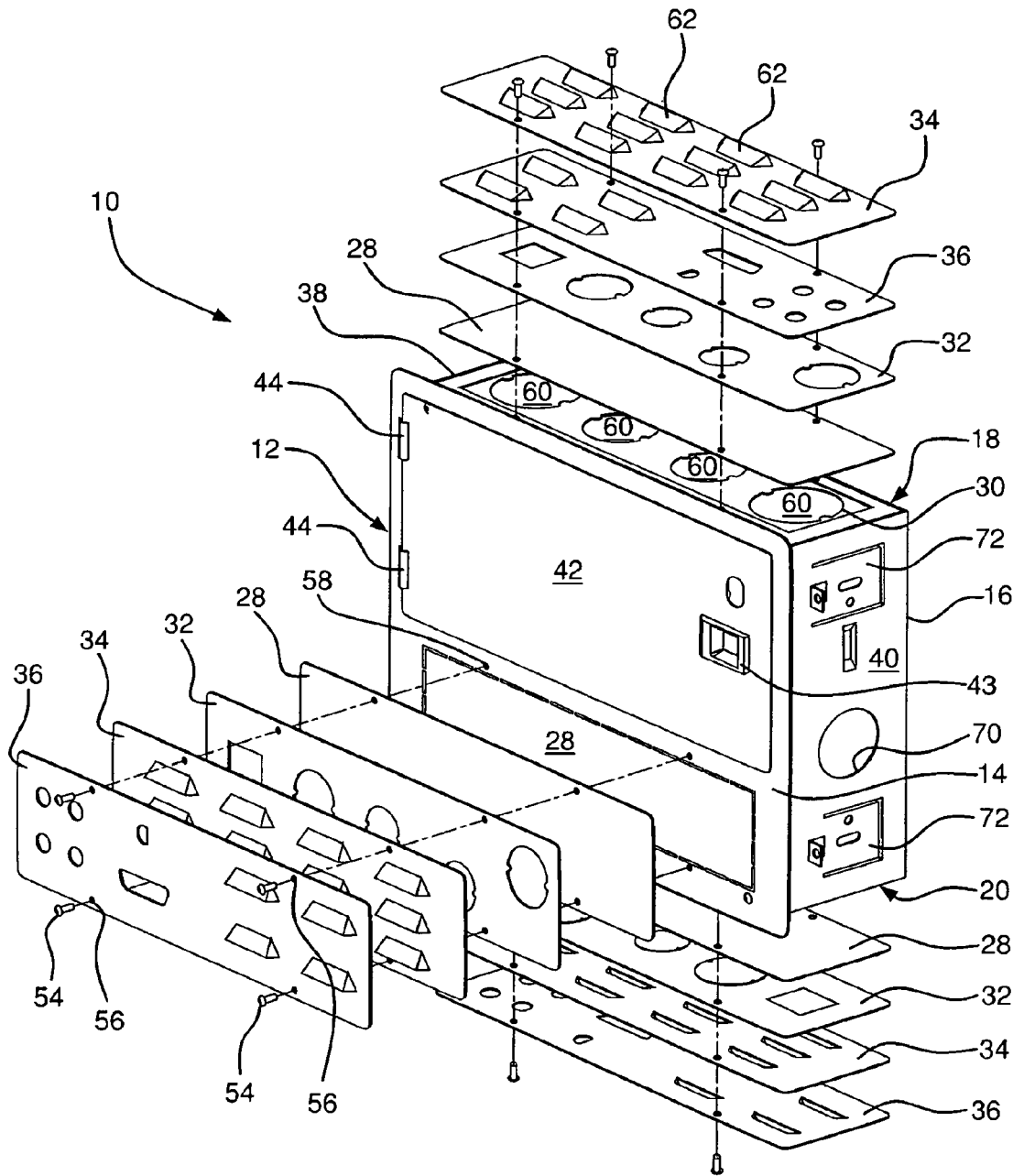
FIG. 1 is an exploded front perspective view of the network enclosure with removable and interchangeable sides on the top, bottom, and front according to a first embodiment of the present invention.
Figure 2:
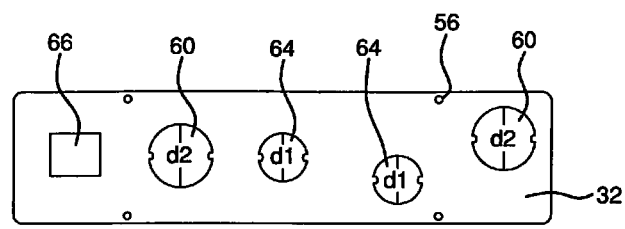
FIG. 2 is a front elevational view of a panel with custom knockouts as seen in FIG. 1.
Figure 3:
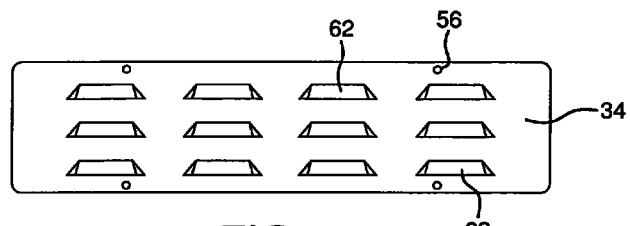
FIG. 3 is a front elevational view of a panel with a plurality of louvers as seen in FIG. 1.
Figure 4:
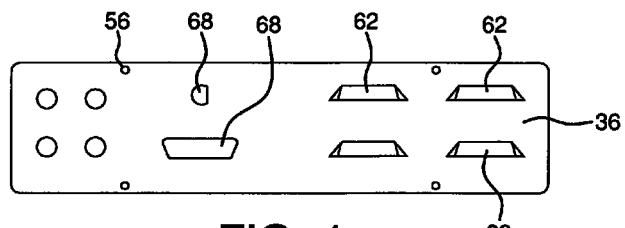
FIG. 4 is a front elevational view of an input and output panel as seen in FIG. 1.
Figure 5:
FIG. 5 is a front elevational view of the blank or solid panel as seen in FIG. 1.
Figure 6:
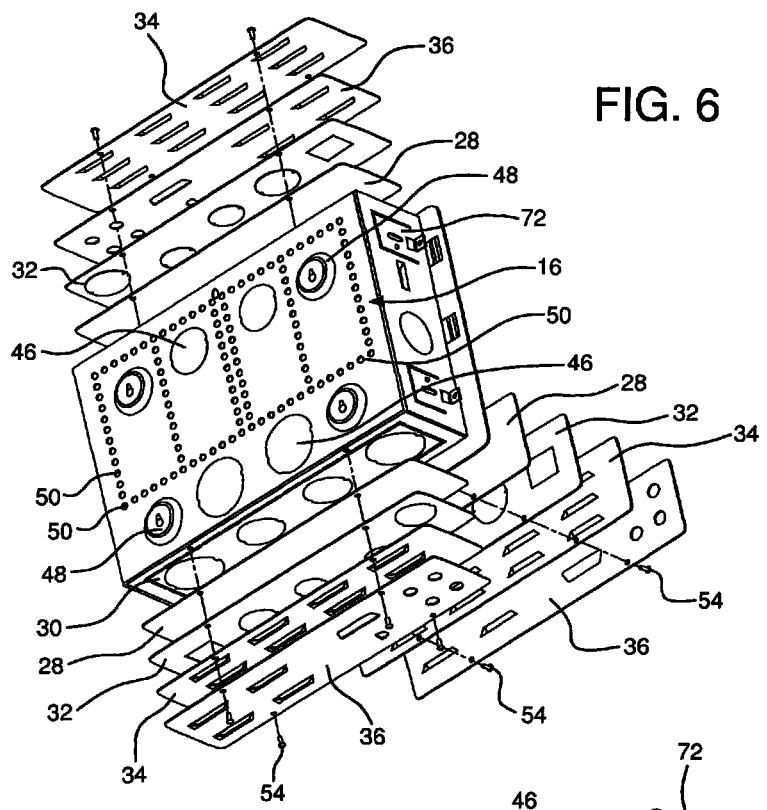
FIG. 6 is an exploded rear perspective view of the network enclosure with removable and interchangeable sides as seen in FIGS. 1-5.
Figure 7:
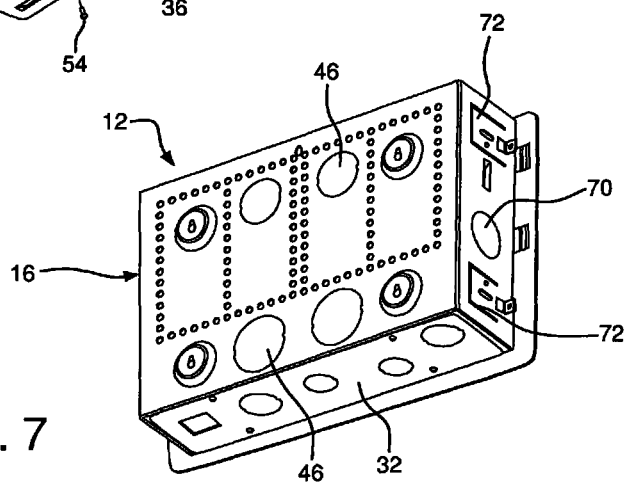
FIG. 7 is a rear perspective view of the network enclosure as seen in FIGS. 1-6 with various panels attached.
Figure 8:
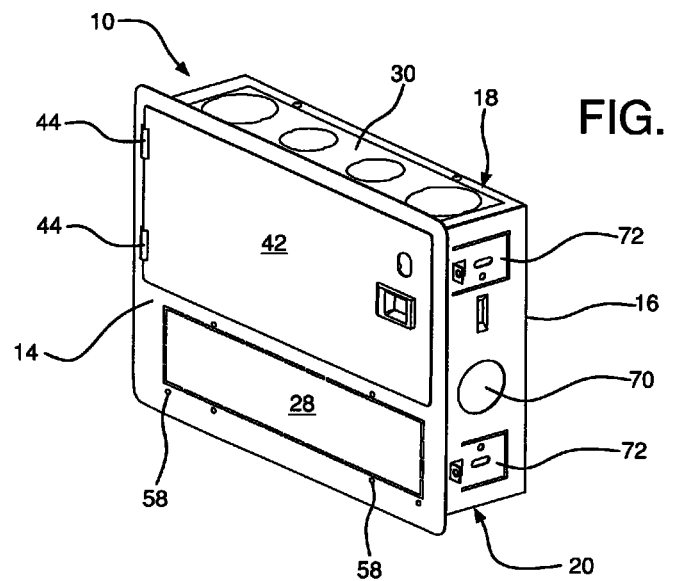
FIG. 8 is a front perspective view of the network enclosure having a blank front panel and a knockout top panel in accordance with the standard assembly according to FIG. 1.
Figure 14:
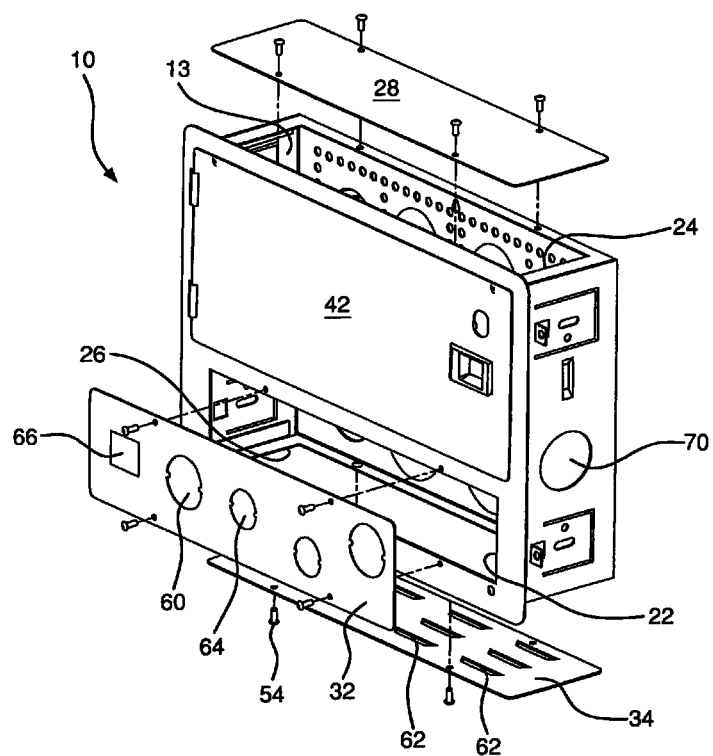
FIG. 14 is an exploded front perspective view of the network enclosure with removable sides according to a third embodiment of the invention showing a custom knockout panel on the front surface, a louvered bottom surface panel, and a blank panel on the top surface with the interior cavity of the housing illustrated.

As seen in FIG. 1, the network assembly or telecommunications enclosure or box 10 for electrical devices comprises a housing 12 having an internal cavity 13, best seen in FIG. 14, for receipt of electrical devices. The housing 12 is defined by a front surface 14, a rear surface 16, a top surface 18, and a bottom surface 20 as well as left and right sides 38 and 40. The top surface 18, bottom surface 20 and front surface 14 each have an opening 22, 24, 26 respectively for receiving one of a plurality of panels 28, 30, 32, 34, 36. The panels 28, 30, 32, 34, 36 are interchangeable such that any one of the panels 28, 30, 32, 34, 36 can be inserted into, and is selectively engageable with and removable from the housing 12 to substantially close each respective opening 22, 24, 26.

The housing 12 is a substantially parallelepiped box formed of stamped sheet metal. The housing 12 is shaped by the front surface 14 disposed parallel to the rear surface 16 and connected by a top surface 18, a bottom surface 20, a left side wall 38, and a right side wall 40. Each of the top surface 18, bottom surface 20, left side wall 38, and right side wall 40 extend perpendicularly between the front surface 14 and the rear surface 16, thus forming the three dimensional housing 12 with substantially 90° angles at the intersection of each of the six surfaces. The side walls 40 each include a circular knockout 70.

The front surface 14 includes a door 42 hinged to the housing 12 and adjacent to the top 18 of the housing 12. The door 42 is connected to the front surface 14 with first and second hinge tabs 44 that permit pivoting of the door 42 to access the interior cavity 13 of the housing 12. The door 42 is substantially rectangularly-shaped with a surface area greater than 50% of the surface area of the front surface 14.

A substantially rectangularly-shaped knockout or panel is located adjacent to the door 42 closest to the bottom surface 20. According to a first embodiment, the blank panel 28 has a surface area less than that of the area of the door 42. The panel 28 is adapted for being removed from the front surface 14 by, for example, being coupled to the box 10 via frangible connections, and replaced by one of a selection of panels 30, 32, 34, 36, as seen in FIGS. 2-5. When the blank panel 28 is removed, there is a substantially rectangularly-shaped opening 22 on the front surface 14. Subsequently, the opening 22 is adapted for receiving thereover one of the additional panels 30, 32, 34, 36 and being releasably coupled to the box via fasteners, such as screws. The blank panel 28 as disclosed in the first embodiment is selected because of its solid surface without any knockouts or louvers. The solid panel 28 is installed when the user does not need to access the cavity 13 of the housing 12 from a particular side. The solid panel 28 can be installed in the front opening 22, the top opening 24, and the bottom opening 26.

Figure 9:
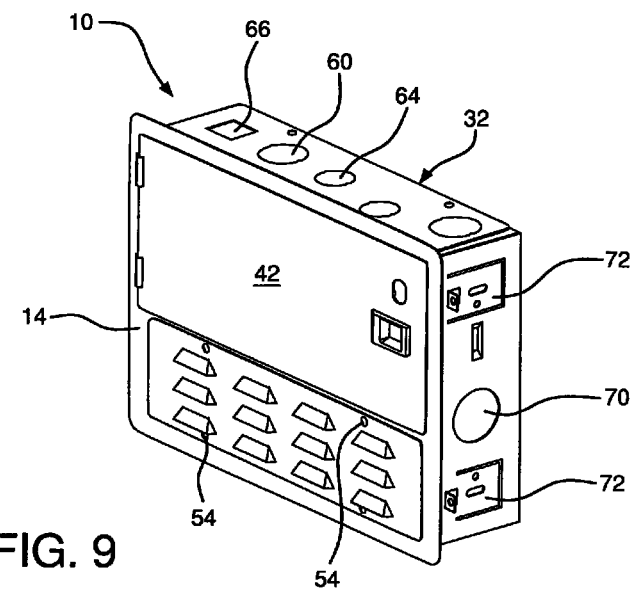
FIG. 9 is a front perspective view of the network enclosure having a louver front panel and a custom knockout top panel installed in accordance with a second embodiment of the invention.

Similarly, the top surface 18 includes a substantially rectangularly-shaped opening 24 for receiving a knockout panel 30. The knockout panel 30 of the first embodiment includes a plurality of substantially circularly-shaped knockouts 60 arranged lengthwise in a series. Turning to FIGS. 8, 9, and 14-17, if the user desires a different configuration of apertures or a blank panel 28, the panel 30 can be removed, thus exposing the top opening 24 and another panel 28, 32, 34, 36 can be installed. FIG. 9 illustrates a second embodiment where a custom knockout panel 32 is installed on the top surface 18 and the vented panel 34 is installed on the front surface 14.

As seen in FIGS. 1, 2, 6, and 7, upon removing the interchangeable plates from the housing 12, the top aperture or opening 24, bottom opening 26, and front opening 22 are exposed, yet the structure of the housing 12 remains the same. The apertures 22, 24, 26 can be removably covered by a solid or blank panel 28, a panel 30 with circular knockouts 60, a panel 32 with custom knockouts 60, 64, 66, a panel 34 with louvers 62, or a panel 36 with input and output structures 62, 68. The left and right sides of the housing 12 include a circular knockout and slotted openings conventional in the art. The bottom surface 20 has a substantially rectangularly-shaped opening 26 for receiving a knockout or panel 32. The rear surface 16 includes a plurality of apertures such as knockouts 46, locks 48, and vented openings 50.

The panel 30 shown at the top 18 of the housing 12 in FIG. 1 is the position as installed in the factory. The housing 12 includes the blank panel 28 attached to the bottom of the front surface 14 and the circular knockout panel 30 attached to the top surface 18. Panel 30 includes a series of circular knockouts 60 arranged along the longitudinal axis of the panel 30 for accepting connectors or a variety of cables. If a user does not need this panel 30, it can be removed and replaced with another suitable panel 28, 32, 34, 36.

Figure 10:
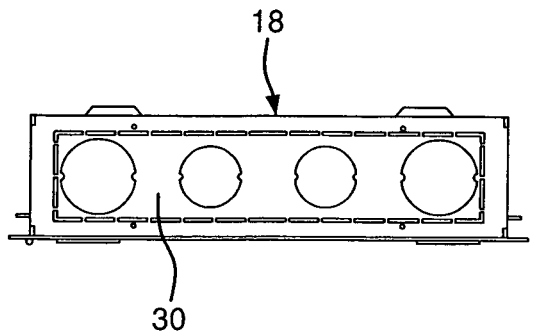
FIG. 10 is a top plan view of the network enclosure according to the first embodiment of the invention as seen in FIGS. 1-8.
Figure 11:
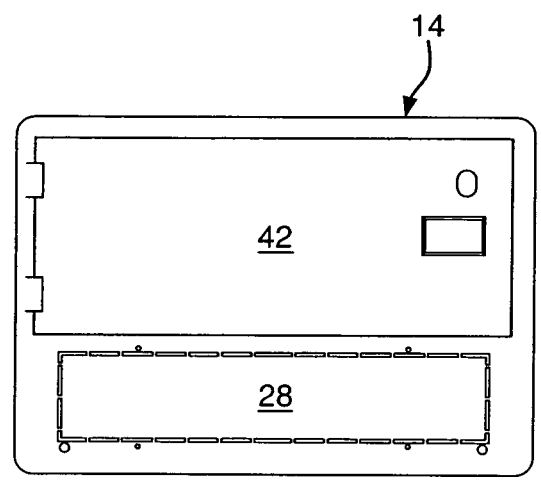
FIG. 11 is a front plan view of the network enclosure according to the first embodiment of the invention as seen in FIGS. 1-8.
Figure 12:
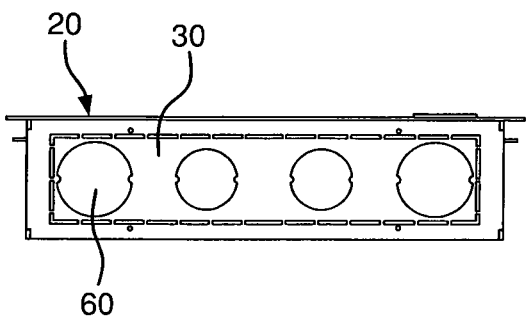
FIG. 12 is a bottom plan view of the network enclosure according to the first embodiment of the invention as seen in FIGS. 1-8.
Figure 13:
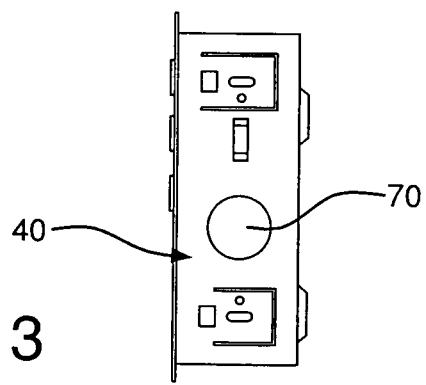
FIG. 13 is a right side plan view of the network enclosure according to the first embodiment of the invention as seen in FIGS. 1-8.

When these panels 28, 30 are removed, any of the additional panels 32, 34, 36 can be installed. As seen in FIG. 9, the circular knockout panel 30 was replaced by the custom knockout panel 32 and the blank panel 28 was replaced by the ventilation panel 34. As seen in FIG. 10, the standard assembly includes the same circular knockout panel 30 installed on the bottom surface 20 as the top surface 18.

Another panel 32 includes custom knockouts 60, 64, 66 such that the panel 32 is covered with a variety of knockout configurations. These knockout configurations 60, 64, 66 can be substantially square 66 or circular 60, 64. The circular custom knockouts 60, 64 can each have different diameters d1, d2. Circular knockout 60 has a larger diameter d2 than the circular knockout 64 with diameter d1.

Figure 15:
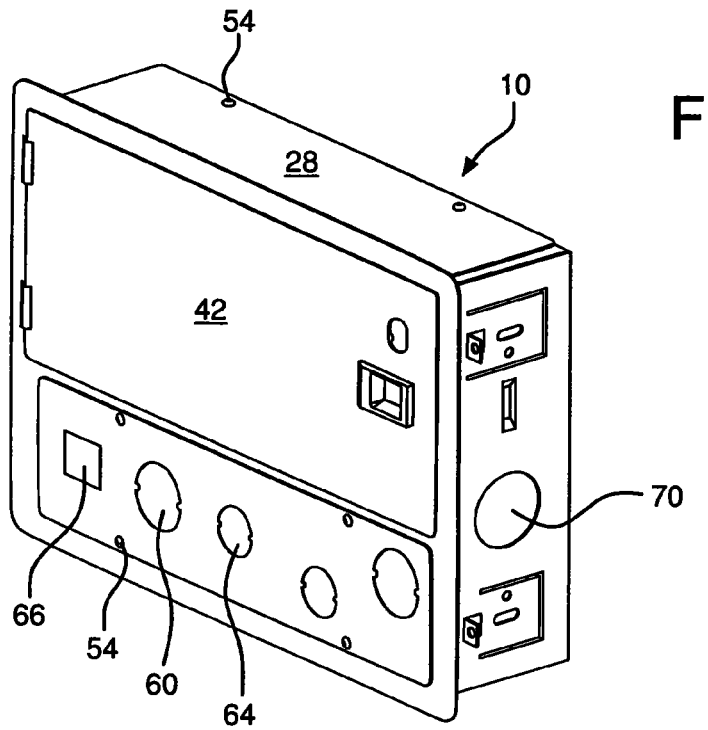
FIG. 15 is a front perspective view of the invention showing the panels attached to the housing according to FIG. 14.
Figure 17:
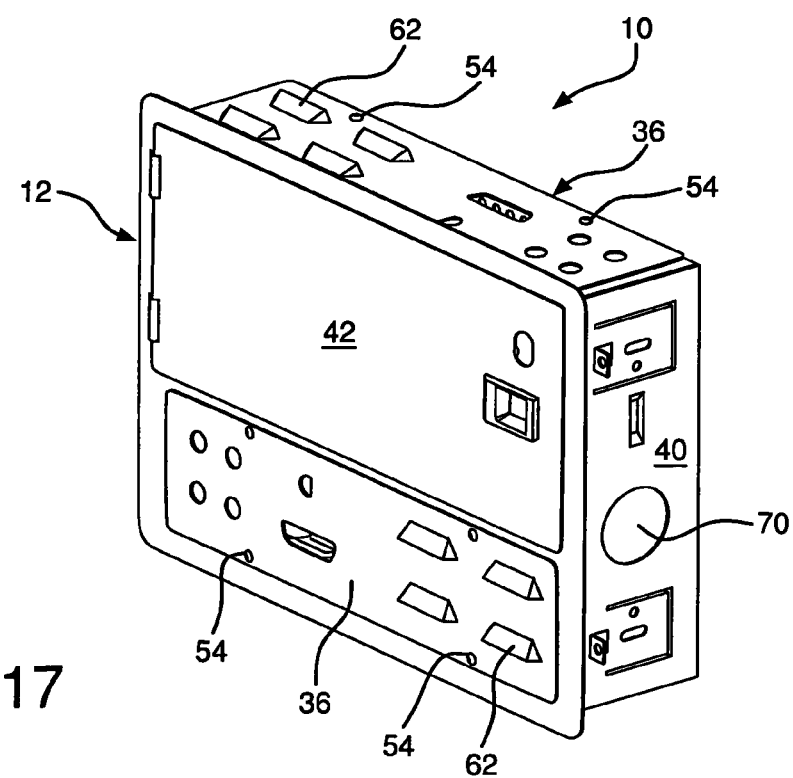
FIG. 17 is a front perspective view of the invention showing the panels attached to the housing according to FIG. 16.
Figure 16:
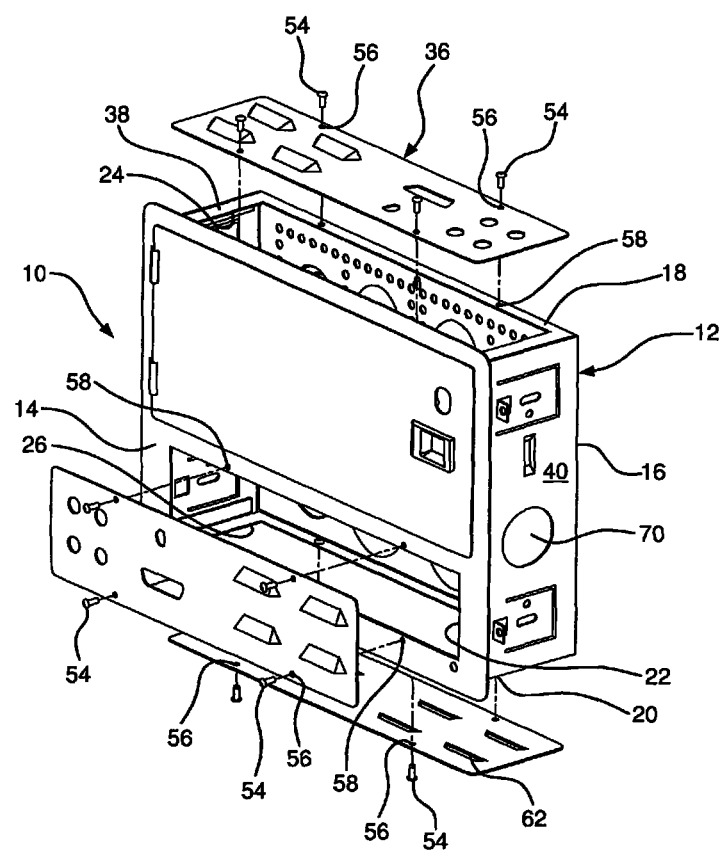
FIG. 16 is an exploded front perspective view of the network enclosure with removable sides according to the fourth embodiment of the invention showing input/output panels installed on the front surface and the top surface of the housing and a louvered bottom panel.

A third embodiment shown in FIGS. 14 and 15 illustrates the custom panel 32 covering the front opening 22. In this embodiment, the user has chosen a blank panel 28 to cover the top opening 24 and a louver panel 32 to cover the bottom opening 26.

Alternatively, the top opening 24, bottom opening 26, and front opening 22 are all capable of receiving the same panel. According to a fourth embodiment seen in FIGS. 16 and 17, the housing 12 includes the same panel 36 covering each of the openings 22, 24, 26. Panel 34 includes a plurality of louvers 62 or vented awnings. In this embodiment, the panel 34 with both input and output options is installed over the front opening 22, top opening 24, and bottom opening 26. The louvers 62 are preferably arranged in equal rows for optimum ventilation. This distribution of louvers 62 aids in the circulation of air into and out of the housing 12, thus preventing the enclosure 10 from overheating. Panel 36 includes a plurality of louvers 62 and input/output openings 68. Depending on the application desired, the user will determine which panel to attach to each opening.

Each of the panels 28, 30, 32, 34, 36 includes a plurality of circularly-shaped panel openings 56 along an outermost edge of the panel surface for receiving an attachment means 54. The attachment means 54 secures the panels to the circularly-shaped surface openings 58 adjacent to the exterior edge of the top opening 24, front opening 22, and bottom opening 26 of the housing 12. Preferably, a plurality of screws 54 are inserted into the panel openings 56 and surface openings 58 for connecting each of the panels to the housing 12.

While particular embodiments have been chosen to illustrate the invention, it will be understood by those skilled in the art that various changes and modifications can be made therein without departing from the scope of the invention as defined in the appended claims.

What is claimed is:

1. An enclosure for electrical devices comprising:
   a housing having an internal cavity for receipt of the electrical devices;
   a first opening and a second opening in said housing;
   first and second sets of interchangeable panels;
   said first set of interchangeable panels including at least two panels having different configurations and selectively engageable with said housing to substantially close said first opening; and
   said second set of interchangeable panels including at least two panels having different configurations and selectively engageable with said housing to substantially close said second opening.

2. An enclosure according to claim 1, wherein
   said housing includes a third opening, and
   further comprising a third set of panels, said third set of panels including at least two panels having different configurations and selectively engageable with said housing to substantially close said third opening.

3. An enclosure according to claim 1, wherein
   one of said two panels in said first set of interchangeable panels includes a substantially solid surface, and
   the other of said two panels in said first set of interchangeable panels has at least one aperture therein.

4. An enclosure according to claim 3, wherein
   said at least one aperture is removably covered by a louver.

5. An enclosure according to claim 3, wherein
   said at least one aperture is removably covered by a knock-out.

6. An enclosure for electrical devices comprising:
   a housing having an internal cavity for receipt of the electrical devices, a first opening, a second opening, and a third opening; and
   first, second, and third sets of interchangeable panels;
   said first set of interchangeable panels including at least two panels having different configurations and selectively engageable with said housing to substantially close said first opening;
   said second set of interchangeable panels including at least two panels having different configurations and selectively engageable with said housing to substantially close said second opening;
   said third set of interchangeable panels including at least two panels having different configurations and selectively engageable with said housing to substantially close said third opening.

7. An enclosure according to claim 6, wherein
   one of said two panels in said first set of interchangeable panels includes a substantially solid surface, and
   the other of said two panels in said first set of interchangeable panels has at least one aperture therein.

8. An enclosure according to claim 7, wherein
   said at least one aperture is removably covered by a louver.

9. An enclosure according to claim 7, wherein
   said at least one aperture is removably covered by a knock-out.

* * * * *